(12) United States Patent
Douskey et al.

(10) Patent No.: US 8,762,803 B2
(45) Date of Patent: Jun. 24, 2014

(54) IMPLEMENTING ENHANCED PSEUDO RANDOM PATTERN GENERATORS WITH HIERARCHICAL LINEAR FEEDBACK SHIFT REGISTERS (LFSRS)

(75) Inventors: Steven M. Douskey, Rochester, MN (US); Ryan A. Fitch, Southfield, MI (US); Michael J. Hamilton, Rochester, MN (US); Amanda R. Kaufer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 13/353,727

(22) Filed: Jan. 19, 2012

(65) Prior Publication Data
US 2013/0191695 A1 Jul. 25, 2013

(51) Int. Cl.
*G01R 31/28* (2006.01)
(52) U.S. Cl.
USPC ............... 714/728; 714/724; 714/739
(58) Field of Classification Search
USPC ......... 714/733, 724, 739, 738, 741, 728, 726, 714/729, 734
See application file for complete search history.

(56) References Cited

U.S. PATENT DOCUMENTS

| | | | |
|---|---|---|---|
| 6,961,886 B2 * | 11/2005 | Motika et al. | 714/732 |
| 7,080,298 B2 * | 7/2006 | Kiryu et al. | 714/724 |
| 7,558,996 B2 | 7/2009 | Kiryu | |
| 7,877,655 B2 * | 1/2011 | Le et al. | 714/729 |
| 7,913,136 B2 * | 3/2011 | Gloekler et al. | 714/728 |
| 2007/0140485 A1 | 6/2007 | Ghigo et al. | |
| 2009/0257547 A1 | 10/2009 | Tsai | |

* cited by examiner

*Primary Examiner* — Fritz Alphonse
(74) *Attorney, Agent, or Firm* — Joan Pennington

(57) ABSTRACT

A method and circuit for implementing enhanced Logic Built In Self Test (LBIST) diagnostics, and a design structure on which the subject circuit resides are provided. A plurality of pseudo random pattern generators (PRPGs) is provided, each PRPG comprising one or more linear feedback shift registers (LFSRs). Each respective PRPG includes an XOR feedback input selectively receiving a feedback from another PRPG and predefined inputs of the respective PRPG. A respective XOR spreading function is coupled to a plurality of outputs of each PRPG with predefined XOR spreading functions applying test pseudo random pattern inputs to LBIST channels for LBIST diagnostics.

18 Claims, 5 Drawing Sheets

IMPLEMENTING ENHANCED PSEUDO RANDOM PATTERN GENERATORS WITH HIERARCHICAL LINEAR FEEDBACK SHIFT REGISTERS (LFSRS)

FIELD OF THE INVENTION

The present invention relates generally to the data processing field, and more particularly, relates to a method and circuit for implementing enhanced pseudo random pattern generators (PRPGs) with hierarchical linear feedback shift registers (LFSRs) for Logic Built In Self Test (LBIST) diagnostics, and a design structure on which the subject circuit resides.

DESCRIPTION OF THE RELATED ART

When testing integrated circuits or chips, techniques such as Logic Built In Self Test (LBIST) diagnostics advantageously are used to test memory arrays and logic.

One of the difficulties of tailoring an LBIST function to a particular chip is expanding the number of PRPGs to fit the needs of the chip. Each PRPG must have a unique feedback or risk reducing LBIST coverage due to multiple channels containing the same data over the entire LBIST test. Using different fixed feedback equations means that multiple types of LFSR units are required or each LFSR unit must contain multiple feedback equations. Both of these methods make it difficult to expand the number of LFSRs for large chips.

A need exists for a circuit having an efficient and effective mechanism for executing LBIST diagnostics and implementing the differentiation of PRPG signatures and channel data while cloning engine logic blocks. A need exists for a circuit having an efficient and effective mechanism for executing LBIST diagnostics, monitoring LBIST progress and implementing early LBIST fail detection and indication.

SUMMARY OF THE INVENTION

Principal aspects of the present invention are to provide a method and circuit for implementing enhanced Logic Built In Self Test (LBIST) diagnostics, and a design structure on which the subject circuit resides. Other important aspects of the present invention are to provide such method, circuit and design structure substantially without negative effects and that overcome many of the disadvantages of prior art arrangements.

In brief, a method and circuit for implementing enhanced Logic Built In Self Test (LBIST) diagnostics, and a design structure on which the subject circuit resides are provided. A plurality of pseudo random pattern generators (PRPGs), each PRPG comprising one or more linear feedback shift registers (LFSRs) is provided. Each respective PRPG includes an XOR feedback input for selectively receiving a feedback from another PRPG and predefined inputs of the respective PRPG. A respective XOR spreading function is coupled to a plurality of outputs of each PRPG with predefined XOR spreading functions applying test pseudo random pattern inputs to LBIST channels for LBIST diagnostics.

In accordance with features of the invention, the plurality of pseudo random pattern generators (PRPGs) includes a parent PRPG coupling the XOR feedback input to one or more child PRPG via the XOR spreading function coupled to the plurality of outputs of the parent PRPG. Each child PRPG applying test pseudo random pattern inputs to LBIST channels via the spreading function coupled to the plurality of outputs of the respective child PRPG. The parent PRPG XOR feedback input only receiving the predefined inputs of the parent PRPG.

In accordance with features of the invention, the plurality of pseudo random pattern generators (PRPGs) includes a plurality of child PRPGs. Each child PRPG applying test pseudo random pattern inputs to LBIST channels via the spreading function coupled to the plurality of outputs of the respective child PRPG. At least one child PRPG including the XOR feedback input receiving feedback from another child PRPG.

In accordance with features of the invention, the circuit includes a plurality of child Multiple Input Signature Registers (MISRs) collecting and compressing LBIST channel data. A parent MISR is used to sample the child MISRs. The parent MISR output sampled data is coupled by a test state and sampling interval logic to an early LBIST fail detection register, which receives a test cycle count from LBIST sequence logic. The early LBIST fail detection register reports LBIST errors to a communications interface.

In accordance with features of the invention, the early LBIST fail detection register loads the parent MISR output sampled data and a test cycle time-stamp at certain intervals, reporting errors. The intervals may be linear or logarithmic where the logarithmic interval provides sampling more frequently near a beginning of a test to quickly dispose of bad chips.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuits for implementing enhanced Logic Built In Self Test (LBIST) diagnostics, and a design structure on which the subject circuit resides are provided. The circuits include enhanced pseudo random pattern generators (PRPGs) with hierarchical linear feedback shift registers (LFSRs) and early LBIST fail detection.

Figure 1:
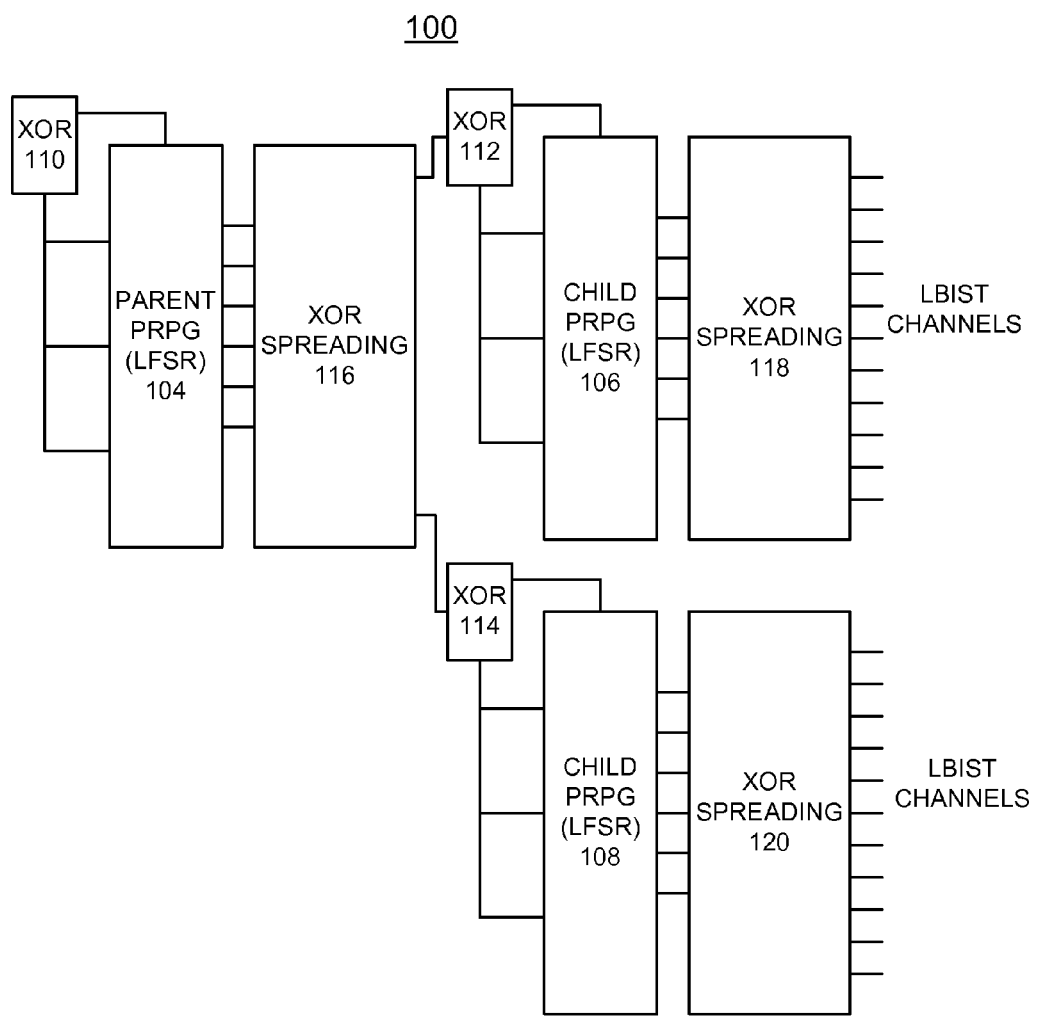
FIGS. 1 and 2 are schematic diagrams illustrating example circuits for implementing enhanced Logic Built In Self Test (LBIST) diagnostics including enhanced pseudo random pattern generators (PRPGs) with hierarchical linear feedback shift registers (LFSRs) in accordance with preferred embodiments.
Figure 2:
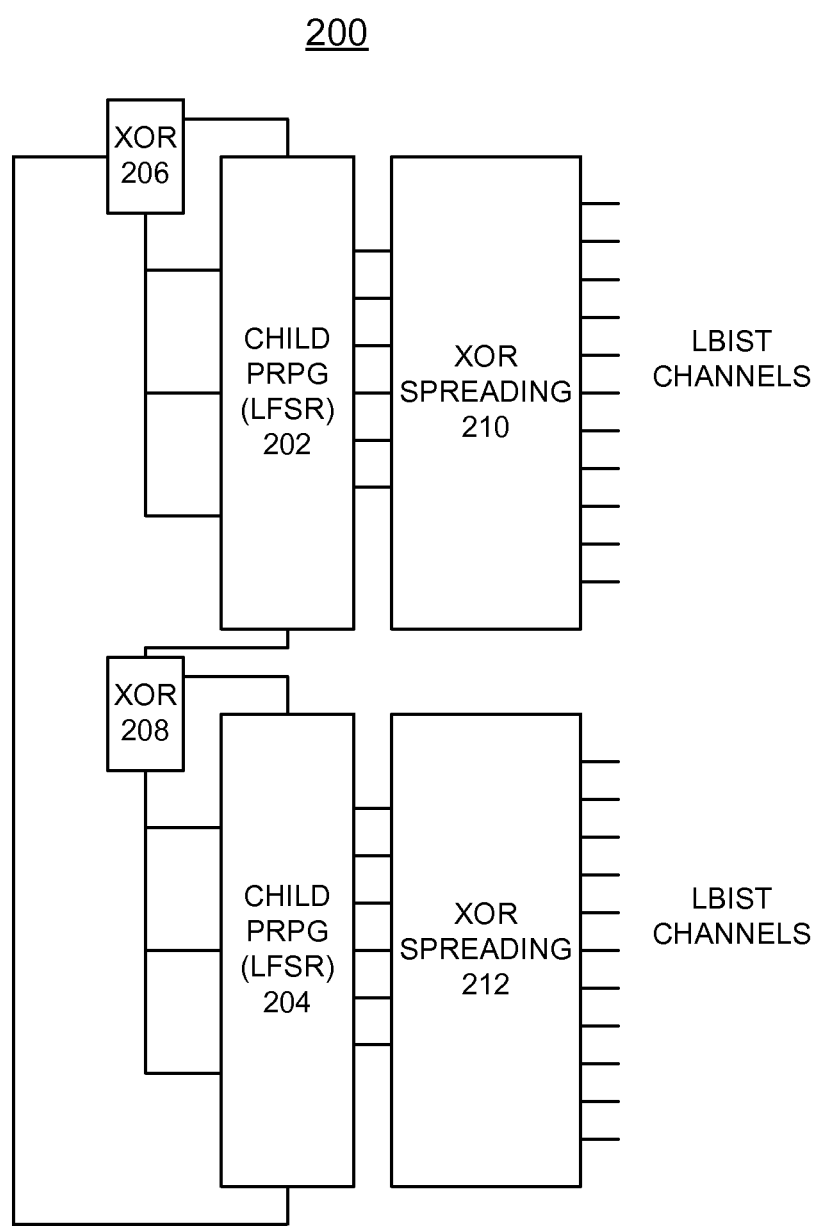

Having reference now to the drawings, in FIGS. 1 and 2, there are shown example circuits generally designated by the reference character 100, 200 for implementing enhanced Logic Built In Self Test (LBIST) diagnostics in accordance with preferred embodiments.

Referring first to FIG. 1, circuit 100 includes a plurality of pseudo random pattern generators (PRPGs) 104, 106, 108, each PRPG comprising one or more linear feedback shift registers (LFSRs). Each PRPG 104, 106, 108 includes a respective Exclusive-Or (XOR) feedback input 110, 112, 114 for selectively receiving feedback from another PRPG and receiving inputs from its respective PRPG 104, 106, 108. The XOR feedback input 110 of PRPG 104 only receives the predefined inputs of the PRPG 104. A respective XOR spreading function 116, 118, 120 is coupled to a plurality of outputs of the respective PRPG 104, 106, 108 with predefined XOR spreading functions 118, 120 applying test pseudo random pattern inputs to LBIST channels for LBIST diagnostics.

In accordance with features of the invention, the plurality of pseudo random pattern generators (PRPGs) 104, 106, 108 includes a parent PRPG 104 providing the XOR feedback input 112, 114 of respective child PRPGs 106, 108 via the XOR spreading function 116 coupled to the plurality of outputs of the parent PRPG 104. A different output of the parent PRPG XOR spreading function 116 is applied to the feedback input 112, 114 of respective child PRPGs 106, 108. Each child PRPG 106, 108 applying test pseudo random pattern inputs to LBIST channels via the respective spreading function 118, 120.

In accordance with features of the invention, in circuit 100 the individual PRPGs 104, 106, 108, including the parent PRPG 104, can use the same feedback equations without the channel data containing the same patterns over a long period.

In accordance with features of the invention, in circuit 100 the resulting data streams from this structure is also qualitatively better than those produced by individual child PRPGs. Individually, there is a limit to the number of consecutive 1s and 0s that can be produced related to the length of the child PRPG 106, 108. This number is substantially expanded when the parent feedback of the parent PRPG 104 is added. The child PRPG 106, 108 can go to an all zero value, which is not normally valid. Essentially, the mixed feedback of parent and child PRPGs 104, 106, 108 allows the respective child PRPG 106, 108 to act like a much larger PRPG. Since many PRPGs, such as the respective child PRPG 106, 108 can share the output of the parent PRPG 104, without duplication of feedback; this is implemented with very few additional latches and logic, as compared with conventional design arrangements.

In accordance with features of the invention, alternatively, the PRPGs could be strung together serially, so that the output of one PRPG feeds the parent input for the next. The first PRPG in series then either has no parent input and feedback normally or can use the output of the last PRPG, making the hierarchy circular, for example, as illustrated and described with respect to circuit 200 in FIG. 2.

Referring also to FIG. 2, circuit 200 includes a plurality of child pseudo random pattern generators (PRPGs) 202, 204, each PRPG comprising one or more linear feedback shift registers (LFSRs). Each child PRPG 202, 204 includes a respective Exclusive-Or (XOR) feedback input 206, 208 for receiving feedback from another PRPG. A respective XOR spreading function 210, 212 is coupled to a plurality of outputs of the respective PRPG 202, 204 with predefined XOR spreading functions 210, 212 applying test pseudo random pattern inputs to LBIST channels for LBIST diagnostics.

Figure 3:
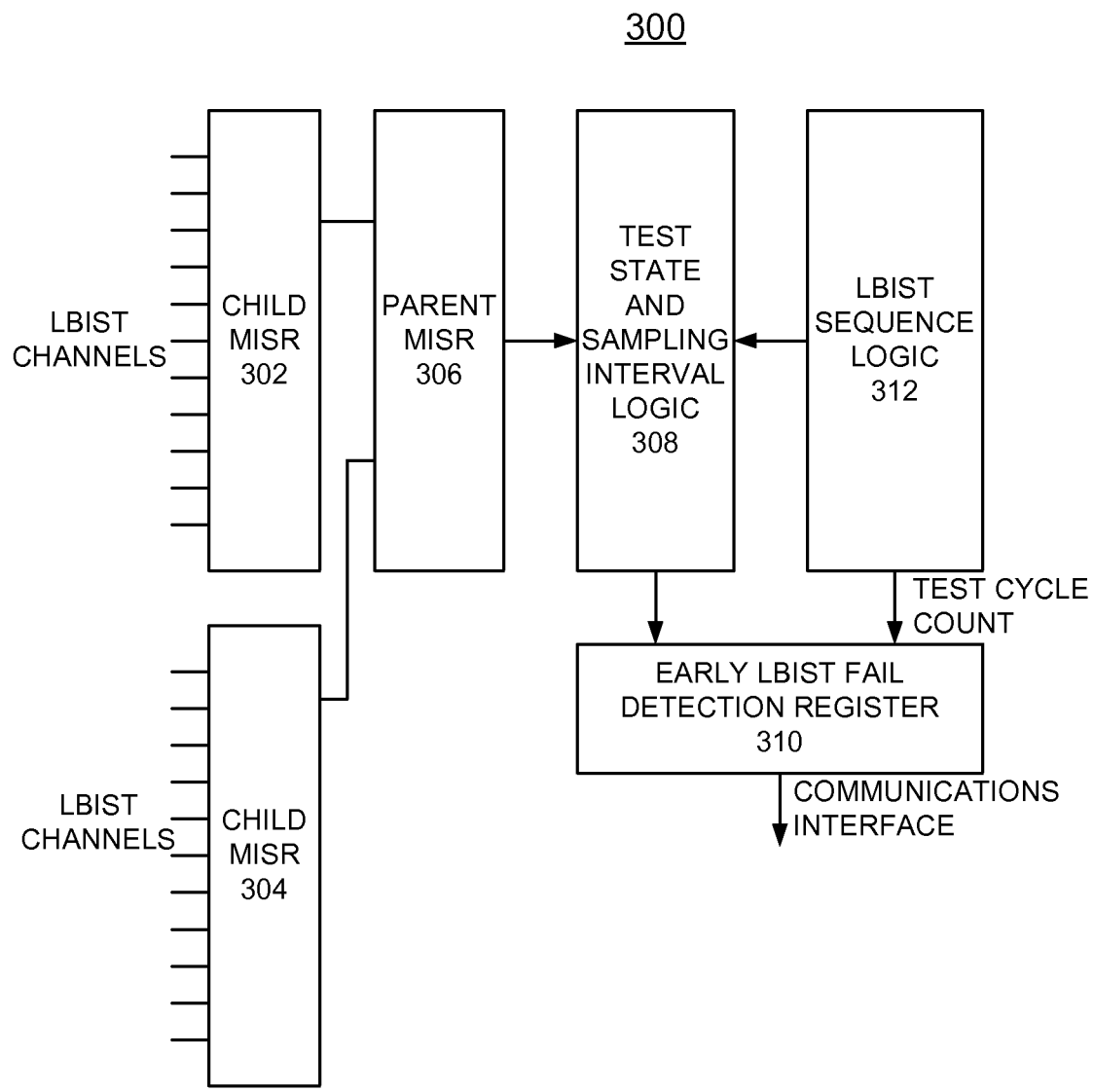
FIGS. 3 and 4 are schematic diagram illustrating example circuits for implementing enhanced Logic Built In Self Test (LBIST) diagnostics including enhanced early LBIST fail detection in accordance with a preferred embodiment.
Figure 4:
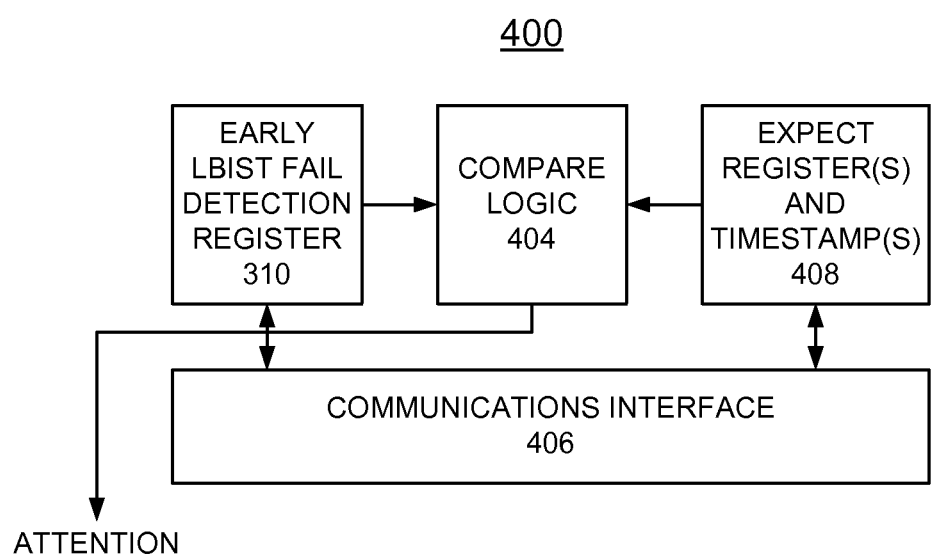

In accordance with features of the invention, another problem that circuits 100, 200 including hierarchical LFSRs can help with is early LBIST fail detection. In FIGS. 3 and 4, there are shown example circuits generally designated by the reference character 300, 400 for use with circuits 100, 200 for implementing enhanced Logic Built In Self Test (LBIST) diagnostics in accordance with preferred embodiments.

Currently there is no way for lab software to tell if LBIST has detected an error until the LBIST test is completed. The results of the LBIST test are collected in the MISRs (Multiple Input Signature Registers). While these values are available at any time, the values change with every scan clock. Most of the time LBIST is scanning during the LBIST test, so the values are not stable for very long. Also, while a corresponding MISR value could be calculated for each scan and test cycle, there is no way to know which scan and test cycle a MISR value correlates to, and there is no way to collect multiple MISRs values simultaneously, so each value would correlate to its own scan and test cycle.

Referring to FIG. 3, circuit 300 includes a plurality of child Multiple Input Signature Registers (MISRs) 302, 304 collecting and compressing LBIST channel data. A parent MISR 306 is used to sample the child MISRs 302, 204 that collect and compress the channel data. For example, the sampled data could be the output of the final latch or an XOR of several MISR bits, to solve the problem of having to check multiple registers.

The parent MISR output sampled data is coupled by a test state and sampling interval logic 308 to an early LBIST fail detection register 310, which receives a test cycle count from LBIST sequence logic 312. The early LBIST fail detection register reports LBIST errors to a communications interface.

The early LBIST fail detection register 310 loads the parent MISR sample data as well as a test cycle time-stamp at certain intervals. The interval could either be a linear interval, such as every thousand test cycles or a logarithmic interval to favor more frequent sampling near the beginning of the LBIST test to quickly dispose of bad chips. A linear value could be programmed ahead of time to a convenient value. Multiple early LBIST fail detection registers 310 could be implemented to store trailing sampling values if software access time is an issue.

In accordance with features of the invention, the early LBIST fail detection register loads the parent MISR output sampled data and a test cycle time-stamp at certain intervals, reporting errors. The early fail detection could be implemented in hardware as well, for example, as illustrated and described with respect to circuit 400 in FIG. 4. A table of values could be implemented in registers and programmed ahead of time. The early fail detection logic would then compare the current sampled value to the stored value with a matching timestamp or sample number. If the software access time is sufficiently fast, a single expect register could be used and then updated once the test has passed the corresponding test cycle value. Both of these methods could be used to bring LBIST to a graceful stop, rather than software driven reset and issue an attention.

Referring to FIG. 4, circuit 400 includes the early LBIST fail detection register 310 coupled to compare logic 404 and a communications interface 406. The compare logic 404 is coupled to one or more expect registers and timestamps 408 and the communications interface 406. The compare logic 404 reports LBIST errors issuing an attention signal.

In accordance with features of the invention, circuits 300, 400 solve issues for early detection fails during LBIST diagnostics. Loading the parent value into the early LBIST fail detection register 310, at known intervals, ensures that the values are stable to the reference clock and that there only a small number of values to compare against. Adding the time-stamp using LBIST sequence logic 312 ensures that there is a direct value to compare to as well as indicating how far along the test is or the LBIST test status. Typically, system software will poll the LBIST status until LBIST completes. Polling on the early detection fail register 310 provides more useful information that can be used for debug as well as ensuring that LBIST runs in the shortest necessary amount of time. This is especially useful at the tester where test time is critical.

Figure 5:
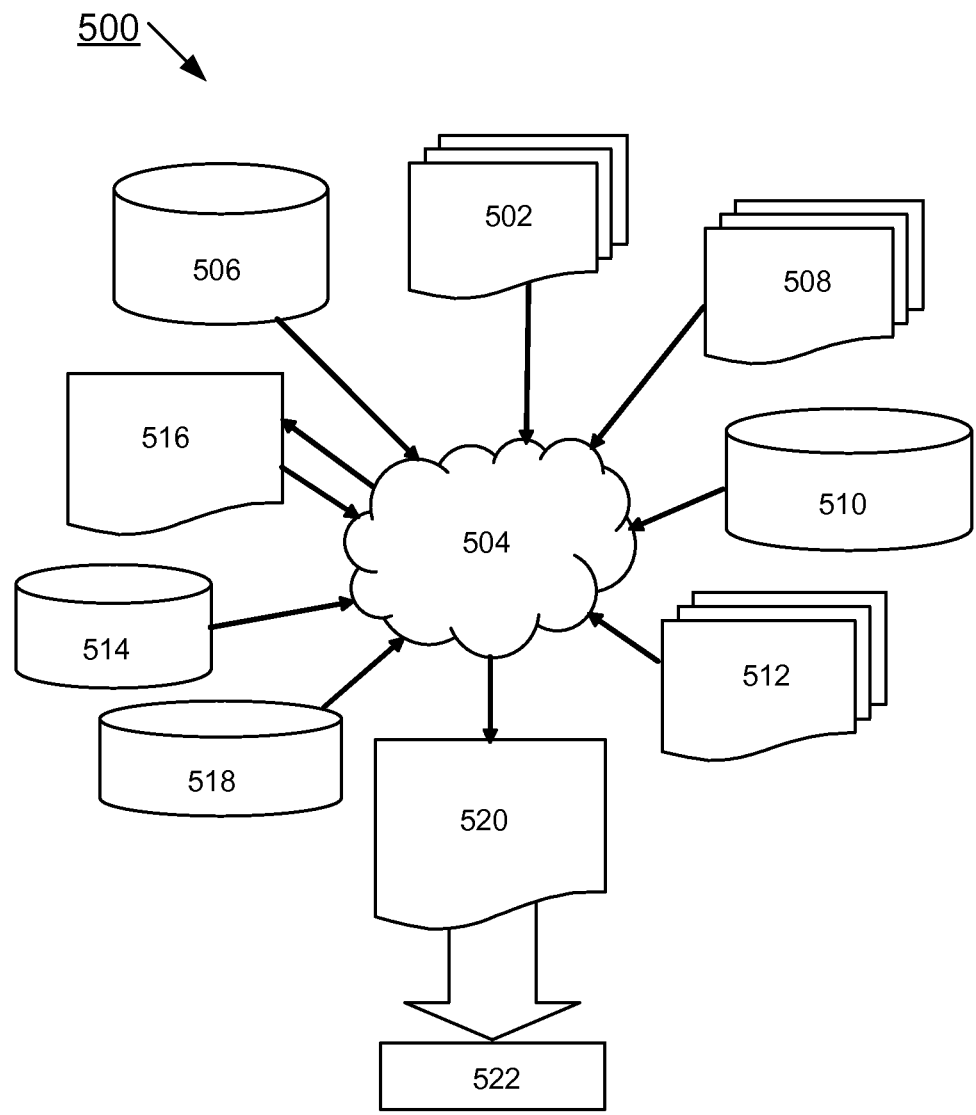
FIG. 5 is a flow diagram of a design process used in semiconductor design, manufacturing, and/or test.

FIG. 5 shows a block diagram of an example design flow 500. Design flow 500 may vary depending on the type of IC being designed. For example, a design flow 500 for building an application specific IC (ASIC) may differ from a design flow 500 for designing a standard component. Design structure 502 is preferably an input to a design process 504 and may come from an IP provider, a core developer, or other design company or may be generated by the operator of the design flow, or from other sources. Design structure 502 comprises circuits 100, 200, 300, 400 in the form of schematics or HDL, a hardware-description language, for example, Verilog, VHDL, C, and the like. Design structure 502 may be contained on one or more machine readable medium. For example, design structure 502 may be a text file or a graphical representation of circuits 100, 200, 300, 400. Design process 504 preferably synthesizes, or translates, circuits 100, 200, 300, 400 into a netlist 506, where netlist 506 is, for example, a list of wires, transistors, logic gates, control circuits, I/O, models, etc. that describes the connections to other elements and circuits in an integrated circuit design and recorded on at least one of machine readable medium. This may be an iterative process in which netlist 506 is resynthesized one or more times depending on design specifications and parameters for the circuits.

Design process 504 may include using a variety of inputs; for example, inputs from library elements 508 which may house a set of commonly used elements, circuits, and devices, including models, layouts, and symbolic representations, for a given manufacturing technology, such as different technology nodes, 32 nm, 45 nm, 90 nm, and the like, design specifications 510, characterization data 512, verification data 515, design rules 516, and test data files 518, which may include test patterns and other testing information. Design process 505 may further include, for example, standard circuit design processes such as timing analysis, verification, design rule checking, place and route operations, and the like. One of ordinary skill in the art of integrated circuit design can appreciate the extent of possible electronic design automation tools and applications used in design process 505 without deviating from the scope and spirit of the invention. The design structure of the invention is not limited to any specific design flow.

Design process 504 preferably translates an embodiment of the invention as shown in FIGS. 1, 2, 3, and 4 along with any additional integrated circuit design or data (if applicable), into a second design structure 520. Design structure 520 resides on a storage medium in a data format used for the exchange of layout data of integrated circuits, for example, information stored in a GDSII (GDS2), GL1, OASIS, or any other suitable format for storing such design structures. Design structure 520 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, 3, and 4. Design structure 520 may then proceed to a stage 522 where, for example, design structure 520 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing enhanced Logic Built In Self Test (LBIST) diagnostics comprising:
   providing a plurality of pseudo random pattern generators (PRPGs), each PRPG comprising one or more linear feedback shift registers (LFSRs);
   providing each respective PRPG with an Exclusive-Or (XOR) feedback input for selectively receiving a feedback coupled from another PRPG and predefined inputs of the respective PRPG;
   providing a respective XOR spreading function coupled to a plurality of outputs of each PRPG; and
   applying test pseudo random pattern inputs to LBIST channels for LBIST diagnostics with predefined XOR spreading functions; and
   providing a plurality of child Multiple Input Signature Registers (MISRs) collecting and compressing LBIST channel data.

2. The method as recited in claim 1 wherein providing a plurality of pseudo random pattern generators (PRPGs) includes providing a parent PRPG coupling the XOR feedback input to one or more child PRPGs via the XOR spreading function coupled to the plurality of outputs of the parent PRPG; said parent XOR feedback input only receiving the predefined inputs of the parent PRPG.

3. The method as recited in claim 2 includes applying test pseudo random pattern inputs to LBIST channels with said one or more child PRPGs via the spreading function coupled to the plurality of outputs of the respective child PRPG.

4. The method as recited in claim 1 wherein providing a plurality of pseudo random pattern generators (PRPGs) includes providing a plurality of child PRPGs; and each child PRPG applying test pseudo random pattern inputs to LBIST channels via the spreading function coupled to the plurality of outputs of the respective child PRPG.

5. The method as recited in claim 4 includes providing at least one child PRPG including the XOR feedback input receiving feedback from another child PRPG.

6. The method as recited in claim 1 includes providing a parent MISR to sample LBIST channel data from the plurality of child MISRs, and providing test state and sampling interval logic coupling sampled data from said parent MISR to an early LBIST fail detection register.

7. The circuit as recited in claim 6 includes providing a test cycle count from LBIST sequence logic to said early LBIST fail detection register; and reporting LBIST errors to a communications interface with said early LBIST fail detection register.

8. The circuit as recited in claim 6 includes said early LBIST fail detection register loading the parent MISR output sampled data and a test cycle time-stamp at certain intervals; said intervals being linear intervals or logarithmic intervals, where the logarithmic interval loading the parent MISR output sampled data more frequently near a beginning of a LBIST test.

9. A circuit for implementing enhanced Logic Built In Self Test (LBIST) diagnostics comprising:
   a plurality of pseudo random pattern generators (PRPGs), each PRPG comprising one or more linear feedback shift registers (LFSRs);
   each respective PRPG including an Exclusive-Or (XOR) feedback input for selectively receiving a feedback coupled from another PRPG and predefined inputs of the respective PRPG;
   a respective XOR spreading function coupled to a plurality of outputs of each PRPG;
   said plurality of pseudo random pattern generators (PRPGs) including a plurality of child PRPGs; and each child PRPG applying test pseudo random pattern inputs to LBIST channels via the respective spreading function coupled to the plurality of outputs of the respective child PRPG; and
   predefined XOR spreading functions applying test pseudo random pattern inputs to LBIST channels for LBIST diagnostics.

10. The circuit as recited in claim 9 wherein said plurality of pseudo random pattern generators (PRPGs) includes a parent PRPG coupling the XOR feedback input to one or more child PRPGs via the XOR spreading function coupled to the plurality of outputs of the parent PRPG; and said one or more child PRPGs applying test pseudo random pattern inputs to LBIST channels via the spreading function coupled to the plurality of outputs of the respective child PRPG; and said parent XOR feedback input only receiving the predefined inputs of the parent PRPG.

11. The circuit as recited in claim 9 wherein at least one child PRPG having said XOR feedback input receiving feedback from another child PRPG.

12. The circuit as recited in claim 9 includes an early LBIST fail detection register, a plurality of child Multiple Input Signature Registers (MISRs) collecting and compressing LBIST channel data, and a parent MISR to sample LBIST channel data from the plurality of child MISRs, and test state and sampling interval logic coupling sampled data from said parent MISR to said early LBIST fail detection register.

13. The circuit as recited in claim 12 includes a communications interface coupled to said early LBIST fail detection register; and wherein said early LBIST fail detection register loads the parent MISR output sampled data and a test cycle time-stamp at certain intervals, and said early LBIST fail detection register reporting LBIST errors to a communications interface.

14. A design structure embodied in a machine readable medium used in a design process, the design structure comprising:
   a circuit tangibly embodied in the machine readable medium used in the design process, said circuit for implementing enhanced Logic Built In Self Test (LBIST) diagnostics, said circuit comprising:
   a plurality of pseudo random pattern generators (PRPGs), each PRPG comprising one or more linear feedback shift registers (LFSRs);
   each respective PRPG including an Exclusive-Or (XOR) feedback input for selectively receiving a feedback coupled from another PRPG and predefined inputs of the respective PRPG;
   a respective XOR spreading function coupled to a plurality of outputs of each PRPG; and
   predefined XOR spreading functions applying test pseudo random pattern inputs to LBIST channels for LBIST diagnostics, wherein the design structure, when read and used in manufacturing a semiconductor chip produces a chip comprising said circuit.

15. The design structure of claim 14, wherein the design structure comprises a netlist, which describes said circuit.

16. The design structure of claim 14, wherein the design structure resides on storage medium as a data format used for the exchange of layout data of integrated circuits.

17. The design structure of claim 14, wherein the design structure includes at least one of test data files, characterization data, verification data, or design specifications.

18. The design structure of claim 14, wherein said circuit includes an early LBIST fail detection register, a plurality of child Multiple Input Signature Registers (MISRs) collecting and compressing LBIST channel data, and a parent MISR to sample LBIST channel data from the plurality of child MISRs, and test state and sampling interval logic coupling sampled data from said parent MISR to said early LBIST fail detection register for reporting LBIST errors to a communications interface.

* * * * *